(12) United States Patent
Flachowsky et al.

(10) Patent No.: US 9,373,720 B2
(45) Date of Patent: Jun. 21, 2016

(54) THREE-DIMENSIONAL TRANSISTOR WITH IMPROVED CHANNEL MOBILITY

(71) Applicant: GLOBALFOUNDRIES Inc., Grand Cayman, KY (US)

(72) Inventors: Stefan Flachowsky, Dresden (DE); Jan Hoentschel, Dresden (DE); Ralf Richter, Radebeul (DE); Peter Javorka, Radeburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 53 days.

(21) Appl. No.: 14/052,977

(22) Filed: Oct. 14, 2013

(65) Prior Publication Data
US 2015/0102426 A1    Apr. 16, 2015

(51) Int. Cl.
  *H01L 27/088* (2006.01)
  *H01L 29/78* (2006.01)
  *H01L 29/66* (2006.01)

(52) U.S. Cl.
  CPC ........ *H01L 29/785* (2013.01); *H01L 29/66795* (2013.01); *H01L 29/7843* (2013.01)

(58) Field of Classification Search
  CPC .................. H01L 29/785; H01L 29/66795
  USPC ........................................... 257/401; 438/284
  See application file for complete search history.

(56) References Cited

U.S. PATENT DOCUMENTS

| | | | | |
|---|---|---|---|---|
| 7,105,390 B2* | 9/2006 | Brask et al. | ................... | 438/149 |
| 8,445,334 B1* | 5/2013 | Basker et al. | ................. | 438/149 |
| 8,729,634 B2* | 5/2014 | Shen et al. | ..................... | 257/368 |
| 2006/0014338 A1* | 1/2006 | Doris | ............... | H01L 29/41733 438/197 |
| 2006/0261411 A1* | 11/2006 | Hareland | ............ | H01L 29/1054 257/353 |
| 2009/0101978 A1* | 4/2009 | Anderson et al. | ............. | 257/365 |
| 2011/0193141 A1* | 8/2011 | Lin et al. | ........................ | 257/255 |
| 2012/0132989 A1* | 5/2012 | Haensch et al. | .............. | 257/347 |
| 2013/0056827 A1* | 3/2013 | Tsai et al. | ...................... | 257/347 |
| 2013/0134506 A1* | 5/2013 | Yagishita | ....................... | 257/330 |
| 2013/0200468 A1* | 8/2013 | Cai | ................... | H01L 29/66545 257/401 |
| 2013/0200470 A1* | 8/2013 | Liu et al. | ........................ | 257/408 |
| 2014/0134814 A1* | 5/2014 | Wong et al. | .................... | 438/283 |
| 2014/0239395 A1* | 8/2014 | Basker et al. | .................. | 257/347 |
| 2014/0264598 A1* | 9/2014 | Cheng | ................. | H01L 29/7843 257/347 |
| 2015/0041908 A1* | 2/2015 | Adam et al. | ................... | 257/369 |
| 2015/0102426 A1* | 4/2015 | Flachowsky et al. | .......... | 257/401 |

* cited by examiner

*Primary Examiner* — Phat X Cao
*Assistant Examiner* — Mohammad M Hoque
(74) *Attorney, Agent, or Firm* — Amerson Law Firm, PLLC

(57) ABSTRACT

The present invention relates to a semiconductor structure comprising at least a first and a second three-dimensional transistor, wherein the first transistor and the second transistor are electrically connected in parallel to each other, and wherein each transistor comprises a source and a drain, wherein the source and/or drain of the first transistor is at least partially separated from, respectively, the source and/or drain of the second transistor. The invention further relates to a process for realizing such a semiconductor structure.

18 Claims, 7 Drawing Sheets

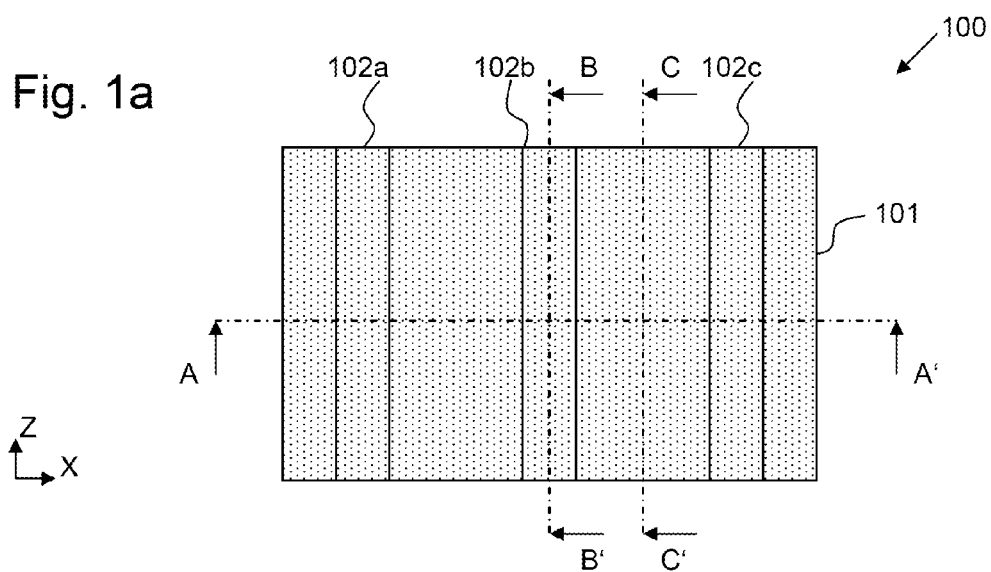
Fig. 1a
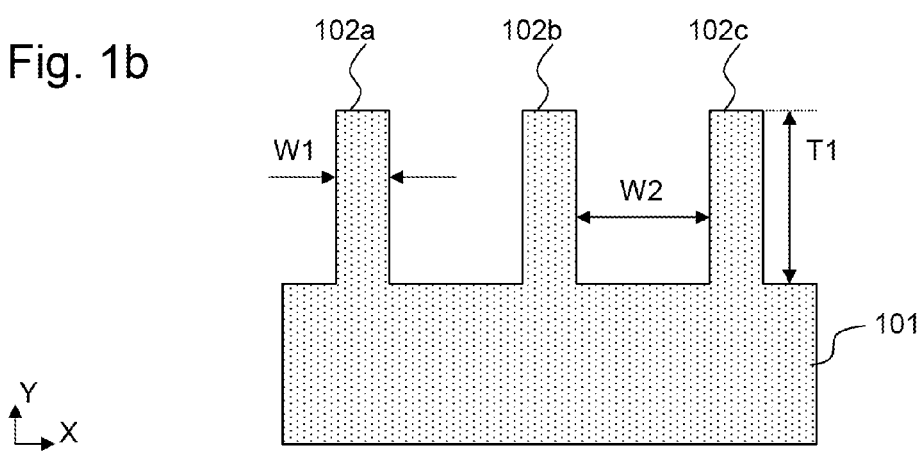
Fig. 1b
Fig. 1c
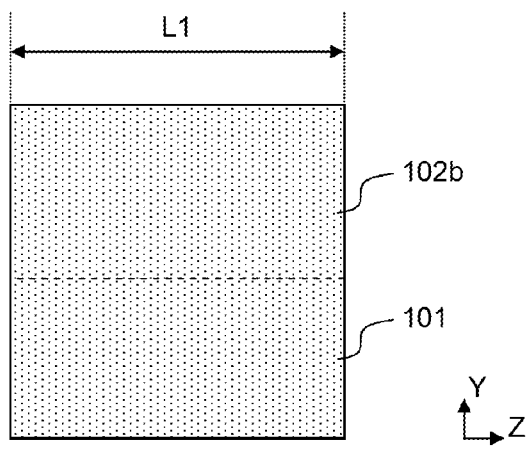
Fig. 1d
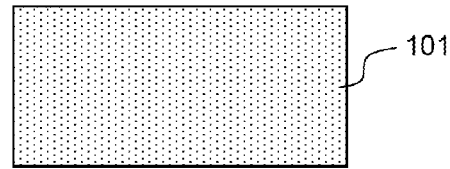

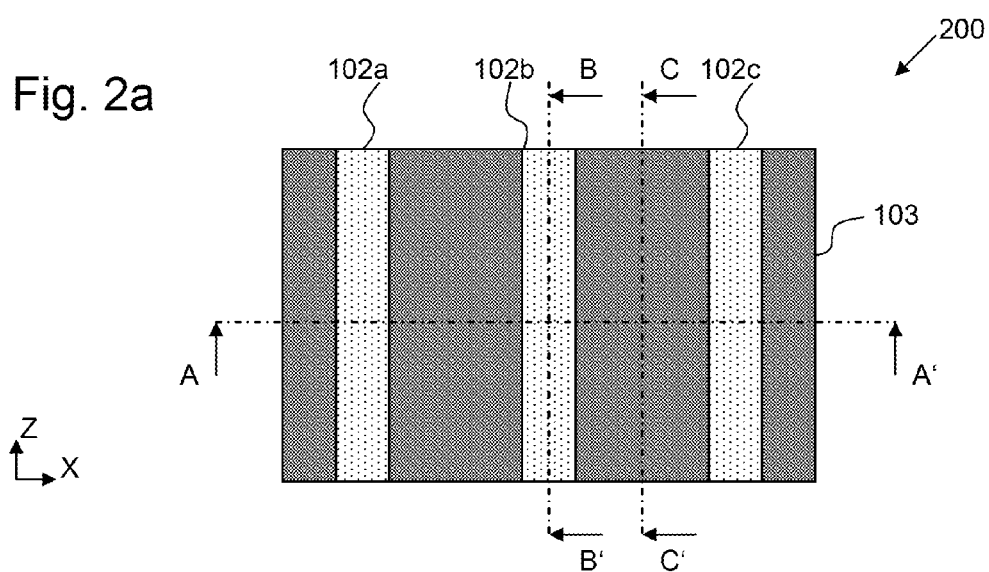
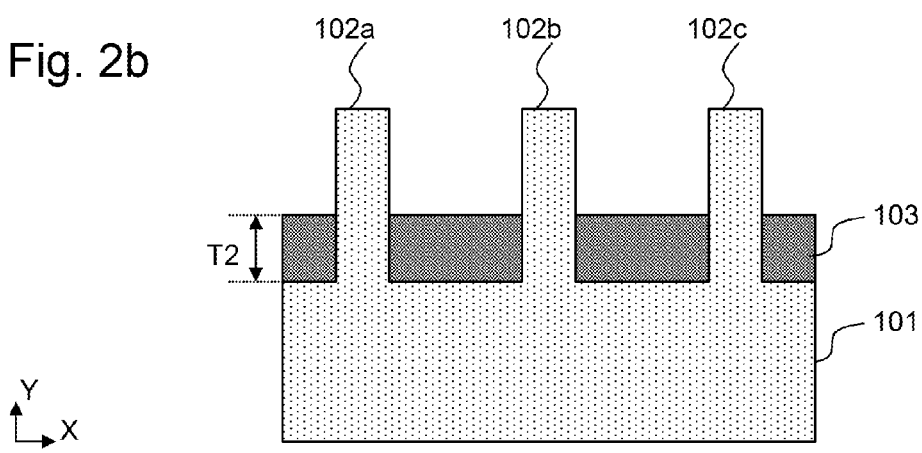
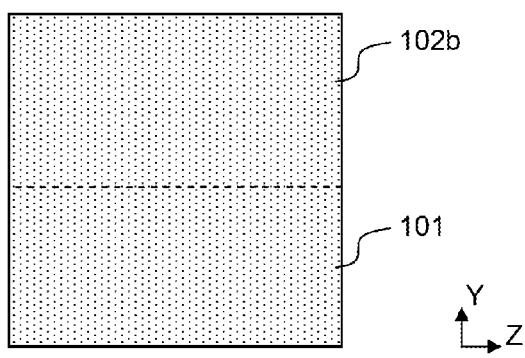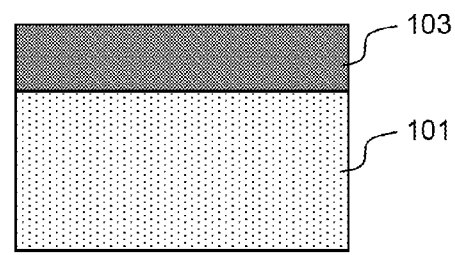

Fig. 4a
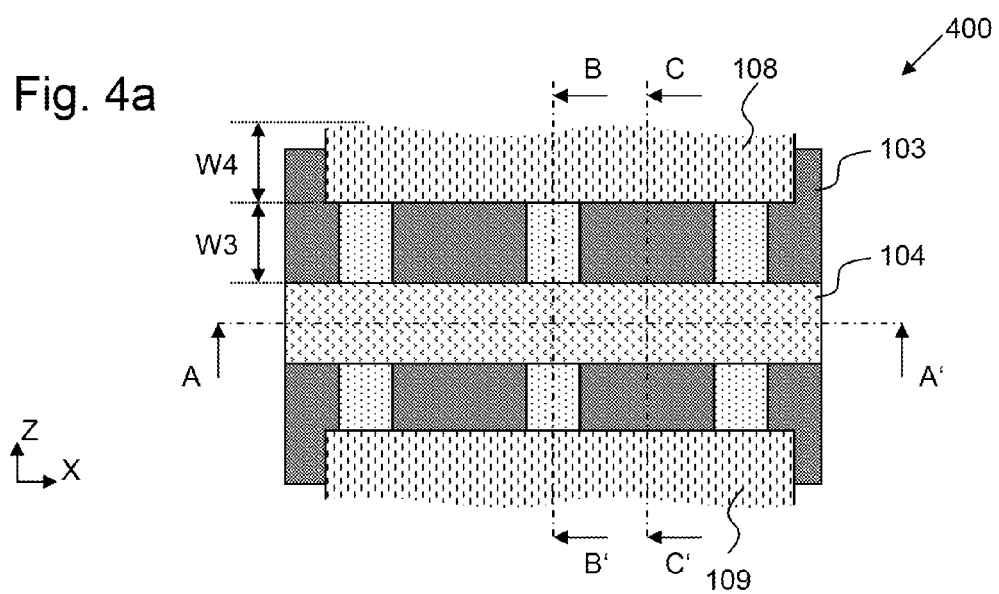
Fig. 4b
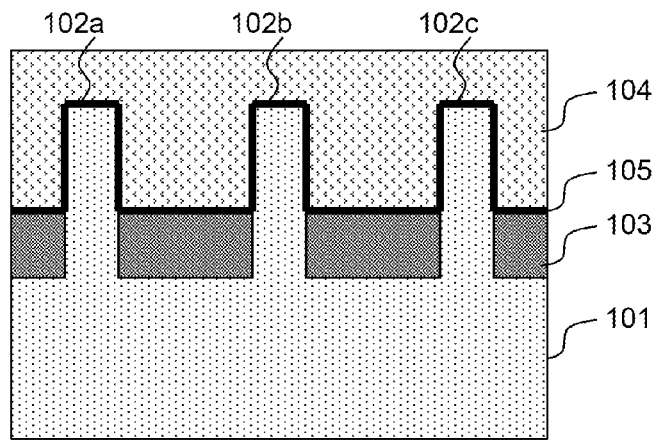
Fig. 4c
Fig. 4d
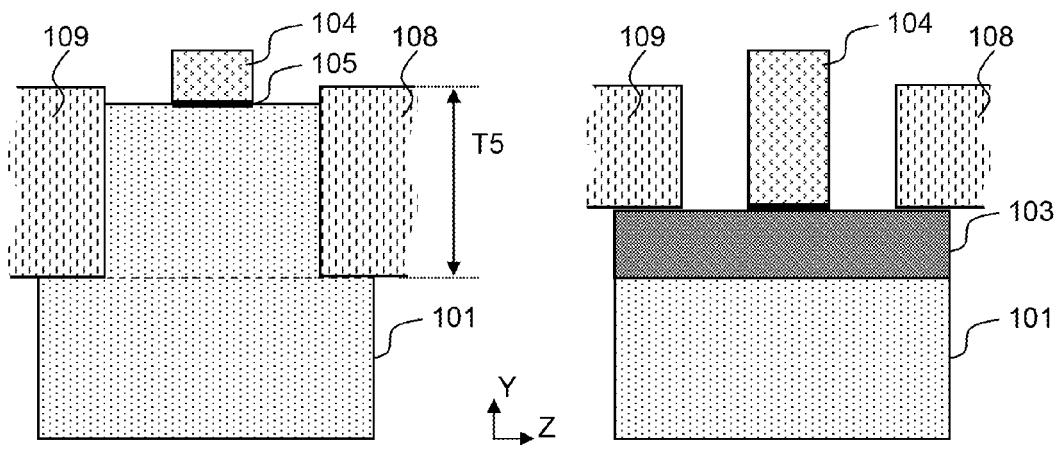

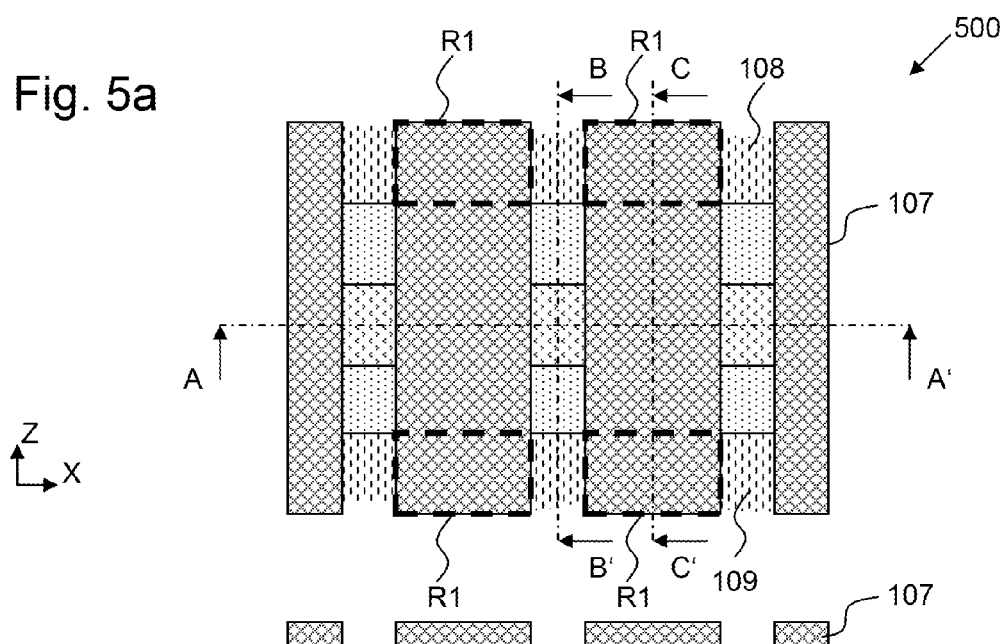
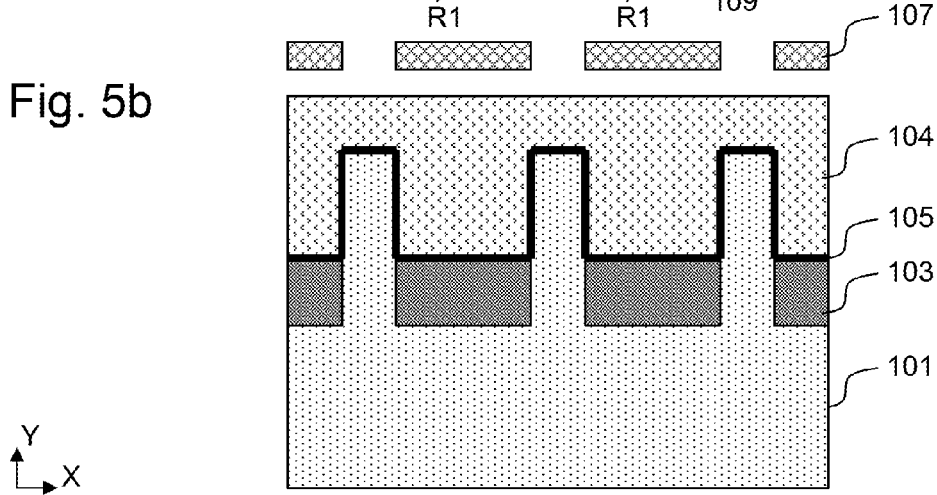
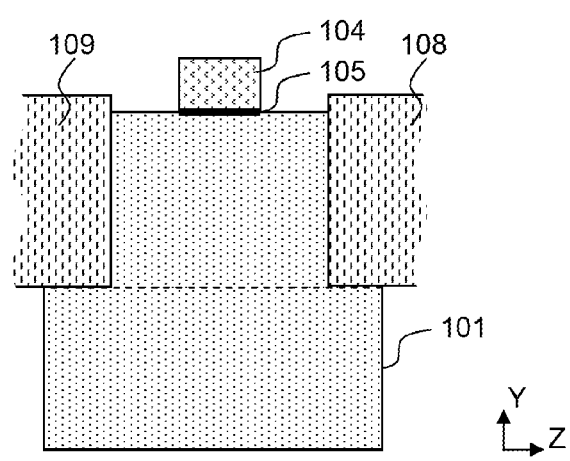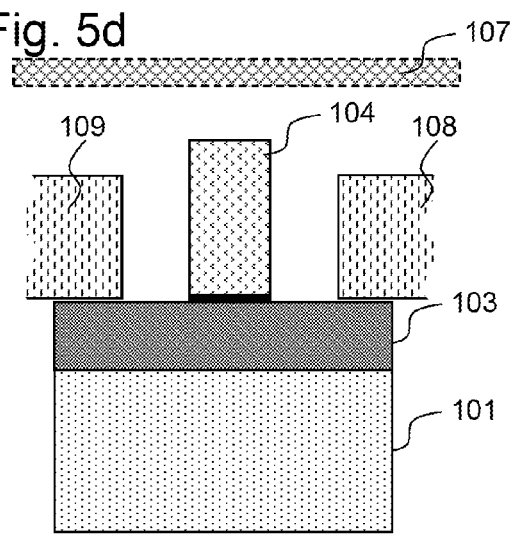

THREE-DIMENSIONAL TRANSISTOR WITH IMPROVED CHANNEL MOBILITY

BACKGROUND OF THE INVENTION

1. Field of the Invention

Generally, the present disclosure relates to highly sophisticated integrated circuits, including transistors having three-dimensional channel architecture, such as FinFETs, and to a manufacturing method thereof capable of improving the electrical characteristics of the transistor.

2. Description of the Related Art

The fabrication of advanced integrated circuits, such as CPUs, storage devices, application specific integrated circuits (ASICs) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel, i.e., the drive current capability of the conductive channel, is controlled by a gate electrode formed adjacent to the channel and separated therefrom by a thin insulating layer. The conductivity of the channel, upon formation of a conductive channel due to the application of an appropriate control voltage to the gate electrode, depends on, among other things, the dopant concentration, the mobility of the charge carriers and, for a planar transistor architecture, the distance between the source and drain, which is also referred to as channel length.

In view of further device scaling based on well-established materials, new transistor configurations have been proposed in which a "three-dimensional" architecture is provided in an attempt to obtain a desired channel width, while at the same time superior controllability of the current flow through the channel is preserved. To this end, so-called FinFETs have been proposed in which a thin sliver or fin of silicon is formed in a thin active layer of an SOI (silicon-on-insulator) or a standard silicon substrate, wherein, on both sidewalls and, if desired, on a top surface, a gate dielectric material and a gate electrode material are provided, thereby realizing a multiple gate transistor whose channel may be fully depleted.

In some conventional approaches for forming FinFETs, the fins are formed as elongated device features followed by the deposition of the gate electrode materials, possibly in combination with any spacers, and thereafter the end portions of the fins may be "merged" by epitaxially growing a source or drain material. In particular, several FinFETs can be connected in parallel in this manner, in order to increase the total drive current. Usually then, in order to realize such parallel connection, the individual FinFETs use the same source and/or drain region.

This, however, has a negative effect on the electrical performances of the FinFET transistors. Among various problems, such an approach with a common source and drain for all FinFETs increases parasitic capacitances between the source and the gate, as well as between the drain and the gate, and it limits the stress type and amount thereof that can be obtained on each of the FinFETs.

In view of the situation described above, the present disclosure relates to semiconductor devices and manufacturing techniques in which FinFETs, or generally three-dimensional transistors, may be formed and potentially connected in parallel to each other while avoiding or at least reducing the effect of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention provides a manufacturing technique and semiconductor devices in which FinFET devices, or generally three-dimensional transistors, may be formed by realizing a common drain and/or source region for a plurality of devices and subsequently etching the drain and/or source region so as to remove at least part of the drain and/or source region placed in between the FET fins, or channels. Alternatively, the drain and/or source regions can be realized with such a mask so as to obtain the same geometry, namely, by having less material from the drain and/or source region in between the FET fins than on the fins themselves. This provides the advantage that the surface area of the drain and/or source region facing the gate is reduced, due to the removal, or the absence during the deposition, of the drain and/or source material, thus reducing the amount of parasitic capacitance between the drain region and the gate and/or between the source region and the gate. Further, by limiting the amount of material of the drain and/or source region in between the channels, structural stress caused by the presence of the drain and/or source material can be controlled differently with respect to the case where the drain and/or source material is present between the various fins. Even further, since more space between the fins is left available due to the at least partial absence of the drain and/or source material, it is possible to further deposit a different material, allowing a further degree of control of the stress of the fins.

One illustrative method disclosed herein may relate to a semiconductor structure comprising at least a first and a second three-dimensional transistor, the first transistor and second transistor being electrically connected in parallel to each other and sharing a common gate, and each transistor comprising a source and a drain, the source and/or drain of the first transistor being at least partially separated from, respectively, the source and/or drain of the second transistor.

One further illustrative method disclosed herein may relate to a process for realizing a semiconductor structure comprising at least a first and a second three-dimensional transistor, the first transistor and second transistor being electrically connected in parallel to each other and sharing a common gate, comprising realizing a single source region and/or a single drain region as, respectively, a drain and/or a source for both the first and second transistor, and removing material from the single source region and/or from the single drain region such that the source and/or drain of the first transistor is at least partially separated from, respectively, the source and/or drain of the second transistor.

One further illustrative method disclosed herein may relate to a process for realizing a semiconductor structure comprising at least a first and a second three-dimensional transistor, the first transistor and second transistor being electrically connected in parallel to each other and sharing a common gate, comprising realizing an independent source and/or an independent drain for each of the first and second transistor.

One further illustrative method disclosed herein may relate to a process for realizing a semiconductor structure comprising at least a first and a second three-dimensional transistor, the first transistor and second transistor being electrically connected in parallel to each other and sharing a common gate, comprising realizing a source and/or a drain for each of the first and second transistor, wherein the source and drain of the first transistor are connected to, respectively, the source and drain of the second transistor by means of, respectively, a source region and a drain region, the source and drain region having a width, along a channel direction of the transistors, shorter than the width of the source and/or the drain.

Thanks to the above-mentioned approaches, it is possible to reduce the area of the source and/or drain facing the gate, or to place this area at a higher distance from the gate, thus limiting the parasitic capacitance between source and gate and/or between drain and gate. Additionally, it is possible to better control the stress on the channels of the transistors and/or on the source and/or drain thereof, by removing at least part of the source and/or drain material and replacing it with another material.

BRIEF DESCRIPTION OF THE DRAWINGS

The disclosure may be understood by reference to the following description taken in conjunction with the accompanying drawings, in which like reference numerals identify like elements, and in which:

FIG. 1a schematically illustrates a top view of a semiconductor structure according to illustrative embodiments;

FIG. 1b schematically illustrates a cross-sectional view along section A-A' of FIG. 1a, according to illustrative embodiments;

FIG. 1c schematically illustrates a cross-sectional view along a section B-B' of FIG. 1a, according to illustrative embodiments;

FIG. 1d schematically illustrates a cross-sectional view along a section C-C' of FIG. 1a, according to illustrative embodiments;

FIG. 2a schematically illustrates a top view of the semiconductor structure of FIG. 1a in another manufacturing stage, according to illustrative embodiments;

FIG. 2b schematically illustrates a cross-sectional view along section A-A' of FIG. 2a, according to illustrative embodiments;

FIG. 2c schematically illustrates a cross-sectional view along a section B-B' of FIG. 2a, according to illustrative embodiments;

FIG. 2d schematically illustrates a cross-sectional view along a section C-C' of FIG. 2a, according to illustrative embodiments;

FIG. 4a schematically illustrates a top view of the semiconductor structure of FIG. 1a in another manufacturing stage, according to illustrative embodiments;

FIG. 4b schematically illustrates a cross-sectional view along section A-A' of FIG. 4a, according to illustrative embodiments;

FIG. 4c schematically illustrates a cross-sectional view along a section B-B' of FIG. 4a, according to illustrative embodiments;

FIG. 4d schematically illustrates a cross-sectional view along a section C-C' of FIG. 4a, according to illustrative embodiments;

FIG. 5a schematically illustrates a top view of the semiconductor structure of FIG. 1a in another manufacturing stage, according to illustrative embodiments;

FIG. 5b schematically illustrates a cross-sectional view along section A-A' of FIG. 5a, according to illustrative embodiments;

FIG. 5c schematically illustrates a cross-sectional view along a section B-B' of FIG. 5a, according to illustrative embodiments;

FIG. 5d schematically illustrates a cross-sectional view along a section C-C' of FIG. 5a, according to illustrative embodiments;

Figure 3A:
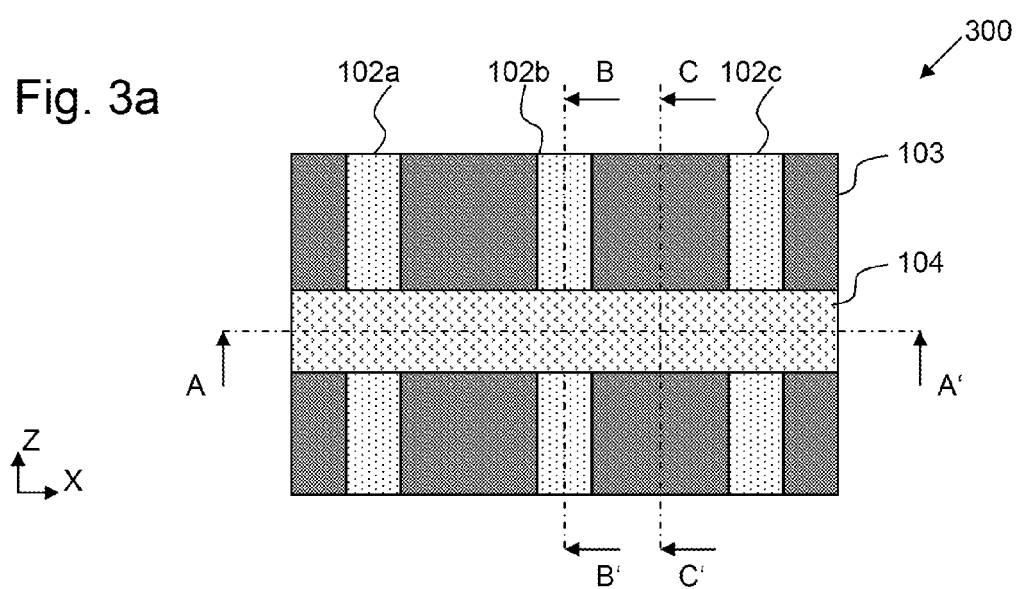
FIG. 3a schematically illustrates a top view of the semiconductor structure of FIG. 1a in another manufacturing stage, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it will be apparent that the embodiments of the disclosure may be practiced without the specific details. In order to avoid obscuring the present disclosure, some well-known circuits, system configurations, structure configurations and process steps are not disclosed in detail.

Generally, the present disclosure contemplates manufacturing techniques and semiconductor devices in which a non-planar transistor configuration, also referred to as a three-dimensional transistor or, more specifically, a FinFET, may be provided on the basis of a process strategy in which initial fins formed from semiconductor-based materials, such as silicon, may be used.

FIG. 1a schematically illustrates a top view of a semiconductor structure 100. FIGS. 1b, 1c and 1d schematically illustrate cross-sectional views of the semiconductor structure 100 taken along lines A-A', B-B' and C-C', respectively.

As can be seen in the figures, the semiconductor structure 100 comprises a substrate 101 in which fins 102a-102c are provided. At least part of the fins 102a-102c acts as a channel for the respective FinFET, as will be described in more detail later. The fins 102a-102c may be realized by etching material from the substrate 101, so as to expose the fins 102a-102c, or by a deposition of material onto the substrate 101 so as to build the fins 102a-102c. Still alternatively, they could be realized by a sidewall image transfer method. In all cases, the resulting structure is the one illustrated in FIGS. 1a-1d. The substrate 101 may consist of, or comprise, silicon or any other semiconductor material, such as germanium (Ge), silicon/germanium (SiGe) or a layered semiconductor structure, such as a silicon-on-insulator (SOI), or a semiconductor alloy, such as a III-V alloy. The fins 102a-102c may be realized from the same semiconductor material of the substrate 101, in particular when obtained by removing material from the substrate 101, but also when realized by deposition of material on the substrate 101, for instance, when using a silicon epitaxial growth on a silicon substrate. Alternatively, the fins 102a-102c may be realized by a different semiconductor material. In both cases, the fins 102a-102c may be doped differently with respect to the substrate 101.

As can be seen in FIG. 1b, the fins 102a-102c extend in a vertical Y direction, preferably with a height T1 included in the range of 60-90 nm, even more preferably with a value of 70 nm. Furthermore, each of the fins 102a-102c has a width W1 in the X direction, preferably in the range of 20-40 nm, even more preferably with a value of 25 nm. Finally, as can be seen in FIG. 1c, the fin 102b, as well as fins 102a and 102c (not illustrated in FIG. 1c), have a length L1 in the Z direction, preferably in the range of 50-80 nm, even more preferably with a value of 60 nm. Also, the fins 102a-102c may be placed at a distance W2 from each other, in the X direction, in the range from 20-40 nm, preferably 35 nm.

Each of the fins 102a-102c may sustain a maximum flow of current, which is limited by the materials and the dimensions used. For some applications, a level of current higher than the one sustainable by a single FinFET may be needed. In those cases, the fins 102a-102c may be connected in parallel by realizing a common source region and/or a common drain region for at least two of the fins 102a-102c, in order to increase the total current flowing between the common source region and/or the common drain region. The realization of such common drain and/or source region will be described in the following description, in particular with reference to FIGS. 4a-4d.

FIGS. 2a-2d schematically illustrate a semiconductor structure 200, resulting from the semiconductor structure 100 following a further manufacturing step. In particular, FIGS. 2a-2d schematically illustrate the semiconductor structure from the same viewpoints of FIGS. 1a-1d, respectively.

As can be seen in FIGS. 2a-2d, the semiconductor structure 200 is obtained from the semiconductor structure 100 by a deposition of an insulating layer 103. Preferably, in some embodiments, the insulating layer 103 may be deposited with a thickness in the Y direction of 100 nm. Subsequently, the insulating layer 103 may be thinned down with a chemical mechanical polishing (CMP) step, to roughly the height value corresponding to the top surface of the fins 102a-102c. Finally, the insulating layer 103 may be anisotropically etched so as to leave a layer of insulating material with a thickness T2 of, preferably, 50 nm, at the bottom of the fins 102a-102c. In other words, in some embodiments, the insulating layer 103 has a height which is smaller than the height of the fins 102a-102c.

Although the above process steps have been provided so as to illustrate one exemplary embodiment for realizing the insulating layer 103, it will be clear to those skilled in the art that the insulating layer 103 may be realized within the fins 102a-102c with alternative process steps. For instance, the insulating layer 103 could be deposited only within the space between the fins 102a-102c, by use of the appropriate mask and deposition steps, so as to achieve the required thickness in a single deposition step, without the use of any CMP and/or etching.

FIGS. 3a-3d schematically illustrate a semiconductor structure 300, resulting from the semiconductor structure 200 following a further manufacturing step. In particular, FIGS. 3a-3d schematically illustrate the semiconductor structure from the same viewpoints of FIGS. 1a-1d, respectively.

As can be seen in FIG. 3a, a dummy gate 104 is realized on the semiconductor structure 200, thereby resulting in the semiconductor structure 300. Although a dummy gate is here described, thereby signifying that in subsequent processes, not illustrated, a gate will replace the dummy gate, the present invention is not limited thereto. In particular, in some embodiments, the gate 104 may be the final gate and not a dummy gate. Thus, in describing the present invention, the term "dummy gate 104" and "gate 104" may be used interchangeably.

Figure 3B:
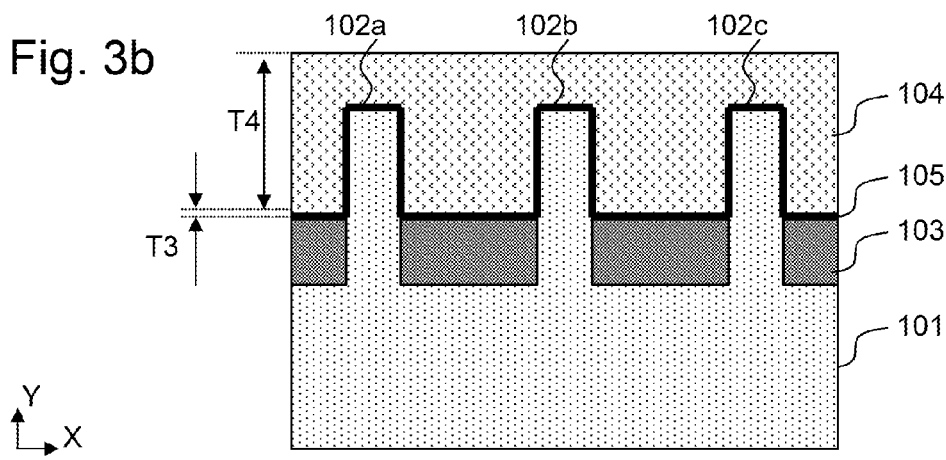
FIG. 3b schematically illustrates a cross-sectional view along section A-A' of FIG. 3a, according to illustrative embodiments.
Figure 3C:
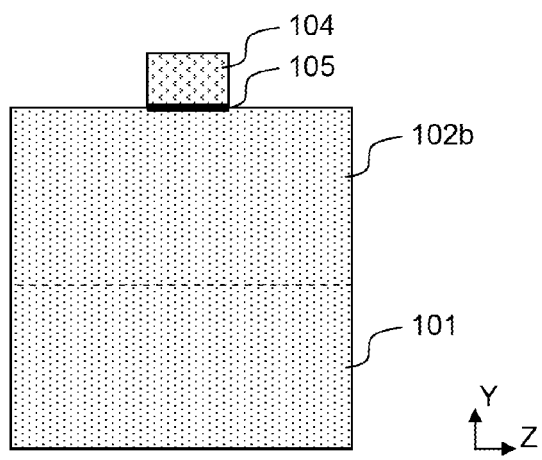
FIG. 3c schematically illustrates a cross-sectional view along a section B-B' of FIG. 3a, according to illustrative embodiments.
Figure 3D:
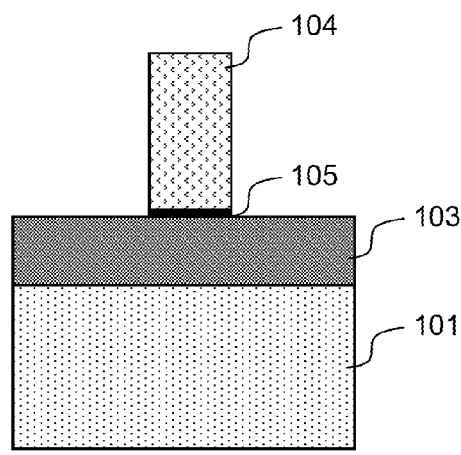
FIG. 3d schematically illustrates a cross-sectional view along a section C-C' of FIG. 3a, according to illustrative embodiments.

In particular, the dummy gate 104 may be realized, for instance, by polysilicon. Preferably, the dummy gate 104 has a width along direction Z, corresponding to the channel length of the FinFETs in the range of 20-30 nm, even more preferably with the value of 26 nm. In other words, the part of the fins 102a-102c under the dummy gate 104 corresponds to the channel of the respective FinFET. The dummy gate 104 is separated by each of the fins 102a-102c by a gate dielectric 105, as can be seen in FIGS. 3b-3d. The gate dielectric 105 is typically an oxide, such as a silicon oxide, preferably having a thickness of 2-3 nm. The gate dielectric 105 may be obtained, for instance, by a chemical vapor deposition or by any other technique allowing the realization of a thin layer on the fins 102a-102c. The dummy gate 104 may be obtained by a deposition of the material realizing the dummy gate 104, followed by a subsequent planarization via a CMP step.

Although not illustrated in the figures, a nitride layer may be realized on top of the dummy gate 104, and/or parts of the fins where the source and drain do not need to be realized, and/or of the insulating layer. The purpose of such a nitride layer is to act as a spacer during the subsequent growth of the source and drain regions 108 and 109 (FIGS. 4a-4d). In this respect, it will be clear to those skilled in the art that such a spacing layer is not necessarily made of nitride, but that any material allowing the subsequent realization of the source and drain in a localized manner may be employed.

FIGS. 4a-4d schematically illustrate a semiconductor structure 400, resulting from the semiconductor structure 300 following a further manufacturing step. In particular, FIGS. 4a-4d schematically illustrate the semiconductor structure from the same viewpoints of FIGS. 1a-1d, respectively.

More specifically, in the semiconductor structure 400, the source and drain regions 108 and 109 are realized on the two ends of each of the fins 102a-102c. By using the previously mentioned nitride layer, or any equivalent masking layer, the positioning of the source and drain regions 108 and 109 may be precisely controlled. In particular, the shape of the source and drain regions 108 and 109 corresponds to the negative image of the nitride, or masking, layer mentioned with reference to FIGS. 3a-3d and not illustrated.

The realization of the source region 108 and the drain region 109 may be done, in some embodiments, by using an epitaxial growth of silicon to merge the fins at their end in the regions 108 and 109, namely, in those regions not covered by the masking or nitride (SiN) layer. Thanks to the nitride or masking layer, the proximity of the source and drain regions 108 and 109 to the dummy gate 104 may be precisely controlled. In an exemplary manufacturing method, the gate 104 is completely encapsulated with nitride and only the future region of the source and drain 108 and 109 are open by a lithography step followed by a corresponding etching step so that selective silicon is grown in those regions. Although the source and drain regions 108 and 109 are here described as being the result of a silicon epitaxial growth, the present invention is not limited thereto and other materials, such as SiGe or III-V alloys, and/or other deposition methods, such as a chemical vapor deposition (CVD) or physical vapor deposition (PVD), may be employed instead. The source and drain regions 108 and 109 may then be subsequently doped, if necessary, for instance by using boron for P-type FETs and P/As for N-type FETs. The source and drain regions 108 and 109 may be placed at a distance W3, in the Z direction, in the range of 10-30 nm, preferably 20 nm, from the gate 104. Additionally, they may have a width W4, in the Z direction, in the range of 20-40 nm, preferably 30 nm.

Following the realization of the source and drain regions 108 and 109, the fins 102a-102c are thus electrically connected in parallel. To access the source and drain regions 108 and 109, corresponding source and drain contacts (not illustrated) may be realized on the source and drain regions. However, such a construction provides a rather wide area of the source and drain regions 108 and 109, on the XY plane, facing the gate 104. This creates a rather high parasitic capacitance between the source region 108 and the gate 104, as well as between the drain region 109 and the gate 104. Additionally, the material of the source and drain regions 108 and 109 may present a bi-axial stress, due to the growing technique employed for those regions. This may limit the amount of current that can flow through the fins 102a-102c, and/or through the source and drain regions 108 and 109.

FIGS. 5a-5d schematically illustrate a semiconductor structure 500, corresponding to the semiconductor structure 400 with an overlapping mask 107. In particular, FIGS. 5a-5d schematically illustrate the semiconductor structure from the same viewpoints of FIGS. 1a-1d, respectively.

More specifically, in FIG. 5a, a mask 107 is illustrated as vertically overlapping the semiconductor structure 500. Here, for a reduction in the number of masks and thereby in the manufacturing costs, the mask 107 may correspond to the mask (not illustrated) already used for the realization of the fins 102a-102c. Here, even if the mask 107 is positioned with a tolerance of 5-10 nm with respect to its original placement for realizing the fins 102a-102c, the removing step may still be carried out successfully. However, any mask that allows the removal of at least part of the material of the source and drain regions 108 and 109 in at least part of the region R1 separating the fins 102a-102c from each other may be used instead. Thanks to the use of the mask 107, selective removal of the material used for the source and drain regions 108 and 109 in the regions R1 between the fins 102a-102c is achieved. The area between the gate 104 and the source and drain regions 108 and 109 may, at this stage, be still protected by the silicon nitride or, more generally, the masking layer from the spacer, used in the previous manufacturing step, so that material of the source and drain regions 108 and 109 may be selectively removed in the portion between the fins 102a-102c, without affecting the rest of the structure.

FIGS. 6a-6d schematically illustrate a semiconductor structure 600, corresponding to the semiconductor structure 400 after the etching process based on the mask 107 has been carried out. In particular, FIGS. 6a-6d schematically illustrate the semiconductor structure from the same viewpoints of FIGS. 1a-1d, respectively.

Figure 6A:
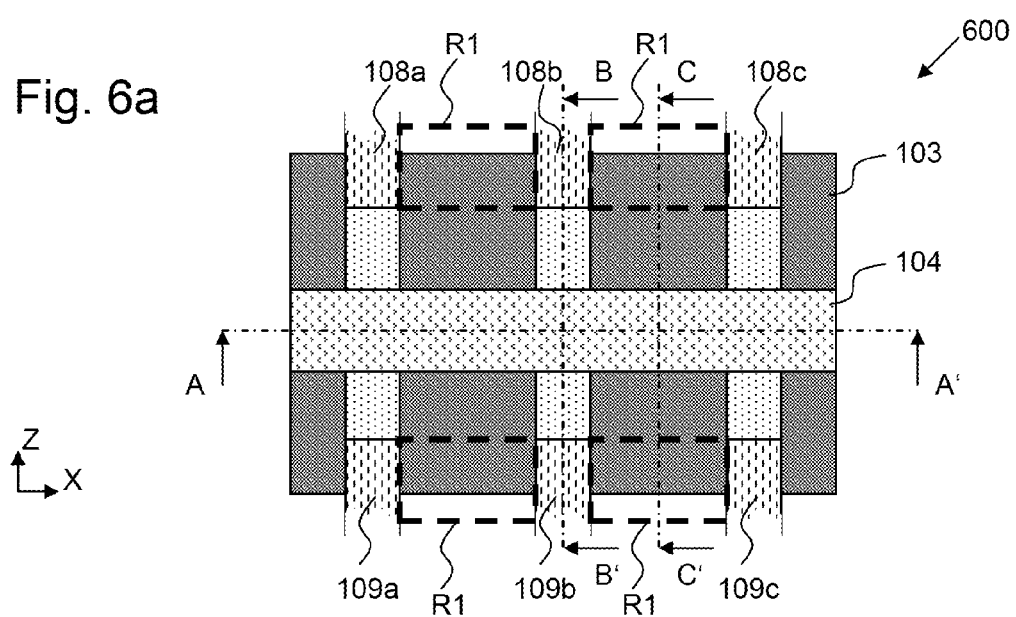
FIG. 6a schematically illustrates a top view of the semiconductor structure of FIG. 1a in another manufacturing stage, according to illustrative embodiments.
Figure 6B:
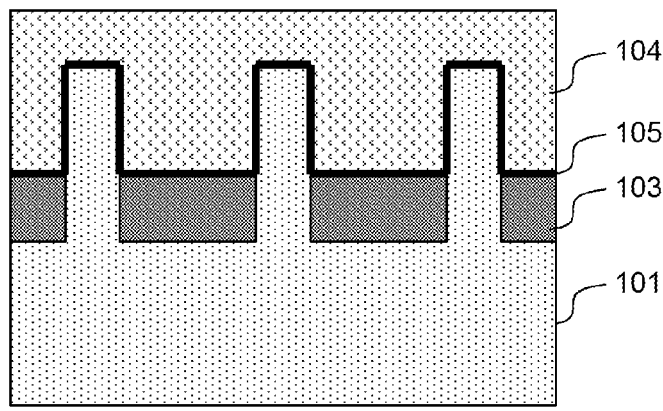
FIG. 6b schematically illustrates a cross-sectional view along section A-A' of FIG. 6a, according to illustrative embodiments.
Figure 6C:
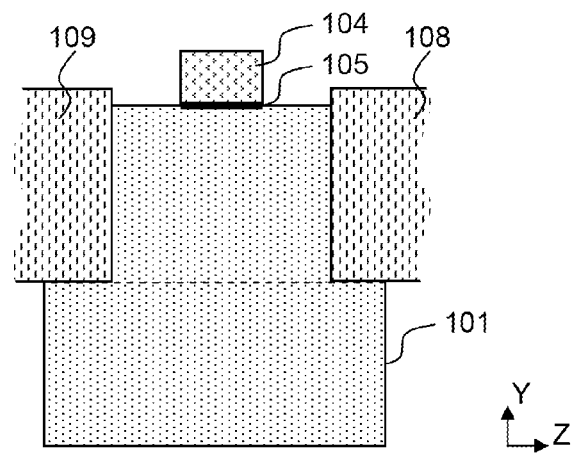
FIG. 6c schematically illustrates a cross-sectional view along a section B-B' of FIG. 6a, according to illustrative embodiments.
Figure 6D:
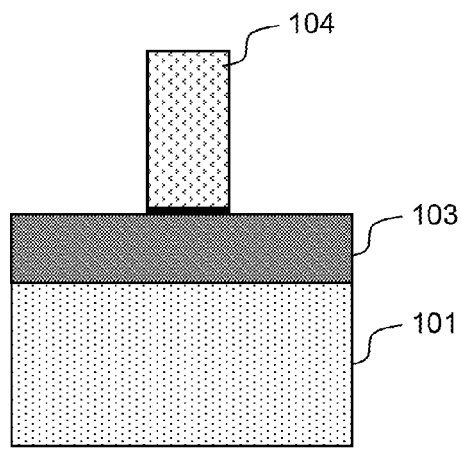
FIG. 6d schematically illustrates a cross-sectional view along a section C-C' of FIG. 6a, according to illustrative embodiments.

Thanks to the removal of the material of the source and drain regions 108 and 109 in regions R1 between the fins 102a-102c, the semiconductor structure 600 as illustrated in FIGS. 6a-6d may be obtained. In particular, as can be seen in FIG. 6a, the regions R1 placed between the fins 102a-102c, aligned with the source and drain regions 108 and 109 in the X direction, do not contain material connecting the sources and drains 108 and 109 to each other. Rather, the source and drain regions 108 and 109 are each independently separated for each fin 102a-102c, thus resulting in independent sources 108a-108c and independent drains 109a-109c.

It should be noted that, in the present embodiment, the mask 107 has been illustrated as covering the entire illustrated source and drain regions 108 and 109 in the Z direction. However, the present invention is not limited thereto. In particular, the source and drain material between the fins 102a-

102c may be completely removed, as illustrated in FIGS. 6a-6d so as to leave each fin with an independent source 108a-108c and drain 109a-109c. Those independent sources and drains may then be electrically connected via their respective contacts and the appropriate use of vias and connection lines.

Figure 7A:
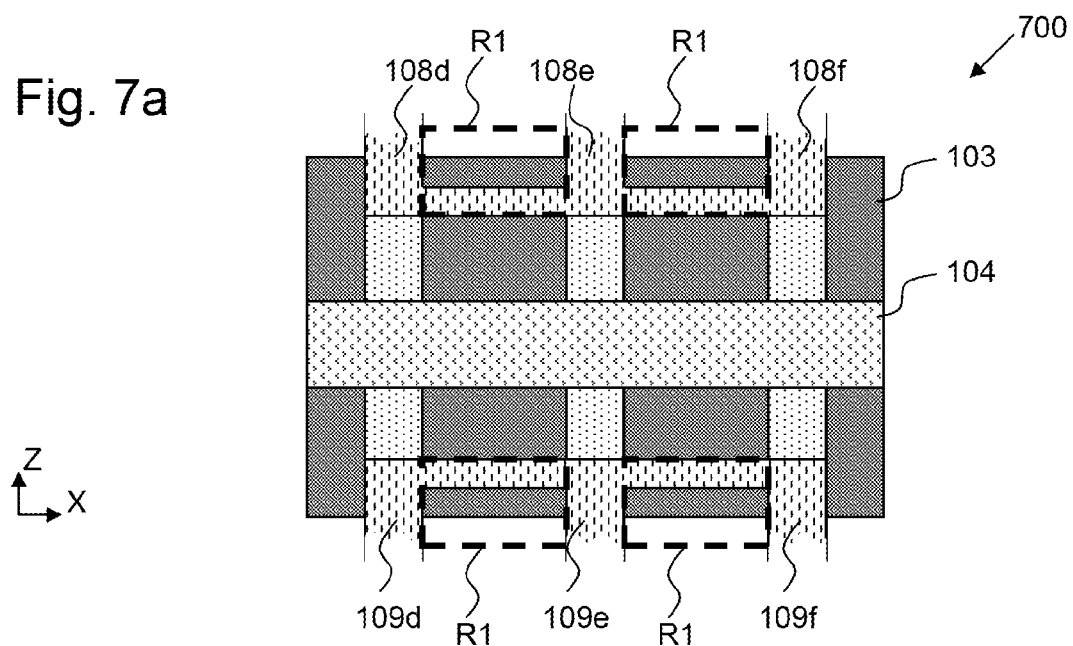
FIG. 7a schematically illustrates a top view of a semiconductor structure, according to illustrative embodiments.
Figure 7B:
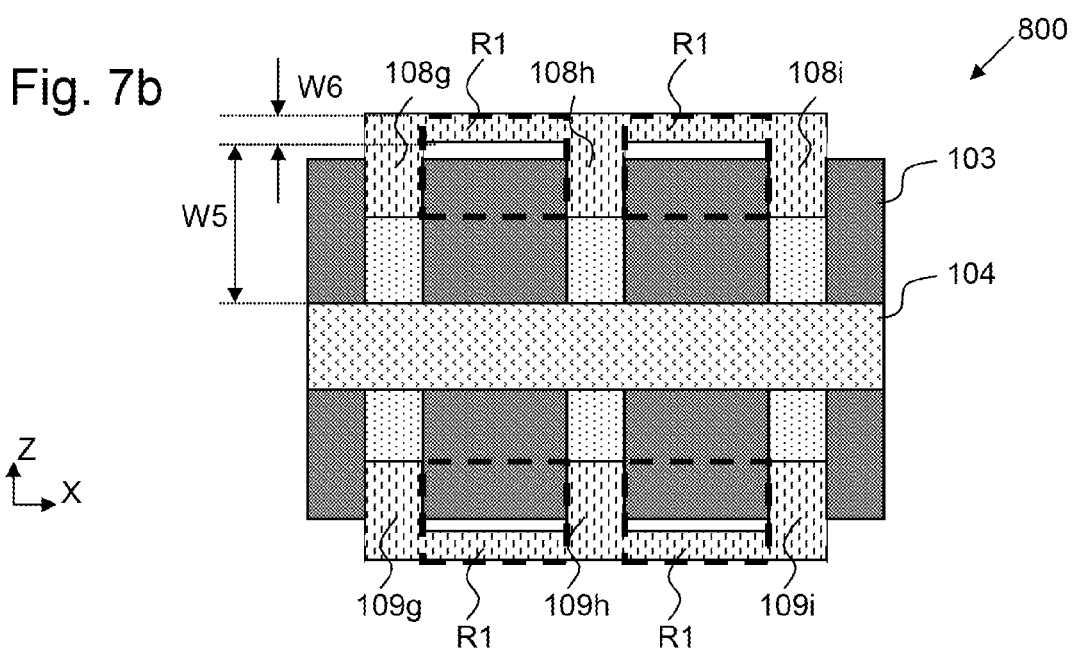
FIG. 7b schematically illustrates a top view of a semiconductor structure, according to illustrative embodiments.

Alternatively, only a portion of the source and drain material may be removed from between the fins 102a-102c, in particular the portion closest, in the Z direction, to the dummy gate 104, as illustrated in FIG. 7b by the semiconductor structure 800. Here, material of the drain and source regions 108 and 109 may be left between the fins 102a-102c at a position further away, in the Z direction, from the dummy gate 104 than the source and drain 108g-108i and 109g-109i on the fins 102a-102c. In particular, the remaining material of the source and drain regions 108 and 109 may start at a distance W5, in the Z direction, in the range of 20-30 nm, preferably 25 nm. Thanks to the latter approach, connection between the sources and drains 108g-108i and 109g-109i of the fins 102a-102c may be ensured by means of the remaining material of the source and drain regions 108 and 109 in between the fins 102a-102c.

Still alternatively, only a portion of the source and drain material may be removed from between the fins 102a-102c, in particular the portion further away, in the Z direction, from the dummy gate 104, as illustrated in FIG. 7a by the semiconductor structure 700. Here, material of the drain and source regions 108 and 109 may be left between the fins 102a-102c at a position as close as, in the Z direction, the dummy gate 104 than the sources and drains 108d-108f and 109d-109f on the fins 102a-102c. Thanks to this approach, connection between the sources and drains 108d-108f and 109d-109f of the fins 102a-102c may be ensured by means of the remaining material of the source and drain regions 108 and 109 in between the fins 102a-102c.

The embodiments illustrated by semiconductor structures 700 and 800, could, for instance, be employed in order to increase the mechanical strength of the fins 102a-102c.

Both in the semiconductor structure 700 and 800, the width, in the Z direction, of the remaining source and drain material may have a width W6, in the Z direction, in the range of 10-20 nm, preferably 15 nm.

Thus, thanks to the described process, a semiconductor structure comprising at least a first and a second three-dimensional transistor, the first transistor and the second transistor being electrically connected in parallel to each other and sharing a common gate 104, may be obtained, in which each transistor comprises a source and a drain, the source and/or drain of the first transistor being at least partially separated from, respectively, the source 108a-108i and/or drain 109a-109i of the second transistor. Even more specifically, each of the first and second transistors comprises a channel, and the source and/or drain of the first transistor are at least partially separated from, respectively, the source and/or drain of the second transistor along a direction parallel to the channel of the first transistor and/or the channel of the second transistor. Further, the sources 108a-108c, 108g-108i and/or drains 109a-109c, 109g-109i of the first transistor are at least partially separated from, respectively, the sources 108a-108c, 108g-108i and/or drains 109a-109c, 109g-109i of the second transistor in the part of the source and/or drain closest to gate 104. Alternatively, the sources 108d-108f and/or drains 109a-109f of the first transistor are at least partially separated from, respectively, the sources 108d-108f and/or drains 109a-109f of the second transistor in the part of the source and/or drain furthest from the gate 104. Still alternatively, the sources 108a-108c and/or drains 109a-109c of the first transistor are completely separated from, respectively, the sources 108a-108c and/or drains 109a-109c of the second transistor. In this last case, each transistor further comprises a channel, and the source and/or drain of the first transistor have a width W1 corresponding to a channel's width of the first transistor, and/or the source and/or drain of the second transistor have a width W1 corresponding to a channel's width of the second transistor. Here, the expression partially separated is intended to mean that the two elements are not completely connected along their sides facing each other, but only a part of the side facing each other is employed for the connection to the other element.

More generally, the present invention may be implemented by either completely removing the material in regions R1, as illustrated in the semiconductor structure 600, or by removing only part of it, as illustrated in the semiconductor structures 700 and 800. It will be clear to those skilled in the art that the semiconductor structures 700 and 800 are only two extreme situations of the same configuration in which some material of the source and drain regions 108 and 109 is left in the regions R1, and that configurations in between those two may be implemented.

Thus, semiconductor structures 600-800 differ from semiconductor structure 400 due to the removal of at least part of the drain and source material between the fins 102a-102c, namely in the regions R1. In particular, in the semiconductor structures 600 and 800, due to the removal of such material in the proximity of the dummy gate 104, it is possible to reduce the capacitance between the dummy gate 104 and the source and drain regions 108 and 109. In fact, as can be seen when comparing the semiconductor structure 600 and 800 with the semiconductor structure 400, the area on the XY plane of the sources and drains 108a-108c and 109a-109c of the semiconductor structure 600 is substantially smaller than the equivalent area for the semiconductor structure 400. Even in the case of the semiconductor structure 800, where only some of the material forming the source and drain regions 108 and 109 is removed from between the fins 102a-102c, while the area on the XY plane of the source and drain regions 108 and 109 of the semiconductor structure 800 and 400 is the same, the average distance of such area from the gate 104 is higher for the semiconductor structure 800 than for the semiconductor structure 400. That is, both when only some of the material of the source and drain regions 108 and 109 is removed, or when all of such material is removed, the capacitance between the source and drain regions 108 and 109 and the dummy gate 104 is reduced, thus improving the electrical characteristics of the FinFETs connected in parallel.

Additionally, by removing material in between the fins 102a-102c, it is possible to convert a biaxial stress from the epitaxial growth of the drain and source 108 and 109 material, such as, for instance, silicon/germanium, into uniaxial stress. In some conditions, in fact, the uniaxial stress in FinFETs achieves a better mobility improvement compared to the biaxial stress. Thus, the semiconductor structures 600, 700 and 800 have better electrical characteristics than the semiconductor structure 400, in which the material between the fins 102a-102c creates a biaxial stress on the fins, not present or reduced in the semiconductor structures 600, 700 and 800.

Still further, the space between the independent sources and drains 108a-108c and 109a-109c of neighboring fins 102a-102c in the semiconductor structure 600, created by the complete removal of the source and drain material, as well as the space between sources and drains 108d-108i and 109d-109i of neighboring fins 102a-102c in the semiconductor structures 700 and 800, created by the partial removal of the source and drain material, may be subsequently filled with a different material, such as a stress overlayer film, for instance, silicon-nitride ($Si_3N_4$), silicon-oxide ($SiO_2$), etc., thus enabling a mobility and drive current improvement. That is, thanks to the use of another material, it is possible to further configure the desired stress on the fins 102a-102c and/or on the sources and drains 108a-108i and 109a-109i so as to improve the respective electrical characteristics of the Fin-FETs based on the fins 102a-102c. Such a further configuration of the stress of the source and drain is not possible in the semiconductor structure 400, where the space R1 between the source and drain regions 108 and 109 of the fins 102a-102c is completely filled by the same source and drain region material.

Although not illustrated, it will be clear to those skilled in the art that some process steps not shown in the figures, such as an RTA for activation and diffusion, and/or a silicide formation, and/or a dummy gate removal and replacement by a high-k/metal gate step, and/or contact formation and BEOL processing as in a conventional FinFET flow have not been illustrated for the sake of clarity.

In alternative embodiments of the present invention, instead of removing the material of the source and drain regions 108 and 109 in between the fins 102a-102c, it is possible to deposit such material only in correspondence with zones illustrated by reference numerals 108a-108i and 109a-109i in the semiconductor structures 600-800. In other words, instead of realizing a deposition of source and drain regions 108 and 109 and a subsequent patterning thereof by means of, for instance, photolithography and etching, it is possible to proceed directly to the localized deposition of sources and drains 108a-108i and 109a-109i in a localized manner. This could be achieved, for instance, by using the mask 700 for the localized deposit of the material of the source and drain regions 108 and 109, in addition to the above-mentioned nitride layer, or more generally a masking layer, covering the dummy gate 104 and acting as a spacer in the Z direction for defining the distance between the source 108 and the dummy gate 104, as well as the distance between the drain 109 and the dummy gate 104. Still in other terms, such localized realization of the sources and drains 108a-108c and 109a-109c could be achieved by using the mask 107 for the deposition step illustrated in FIGS. 4a-4d.

Moreover, although three fins 102a-102c have been illustrated, it will be clear to those skilled in the art that any number of fins higher than two may be used to implement the present invention.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a transistor comprising a source/drain region, the method comprising:
    forming a plurality of spaced apart fins comprised of a semiconductor material;
    after forming said plurality of spaced apart fins, forming a dielectric material layer between each of said plurality of spaced apart fins, said dielectric material layer covering a lower sidewall surface portion and exposing an upper sidewall surface portion of each of said plurality of spaced apart fins;
    forming a common gate structure above said dielectric material layer and across said plurality of fins;
    after forming said common gate structure, forming a continuous merged source region material and a continuous merged drain region material on said plurality of fins and above said dielectric material layer on opposite sides of said common gate structure, wherein said continuous merged source region material and said continuous merged drain region material are each laterally spaced apart from said common gate structure and extend between and physically contact said plurality of fins, each of said continuous merged source region and drain region materials comprising a first portion having a first sidewall surface that faces toward said common gate structure and a second portion having a second sidewall surface that is opposite of said first sidewall surface and faces away from said common gate structure;
    performing at least one etching process to remove said first portions of said respective continuous merged source region and drain region materials including said respective first sidewall surfaces thereof while leaving said second portions of said respective continuous merged source region and drain region materials including said respective second sidewall surfaces thereof in place between and in direct physical contact with said plurality of fins so as to thereby define first and second spaces, respectively, on opposite sides of said common gate structure, said first and second spaces exposing respective first and second surface portions of said dielectric material layer formed between each of said plurality of spaced apart fins; and
    forming a material in said first and second spaces.

2. The method of claim 1, wherein said forming said material in said first and second spaces comprises covering said respective first and second exposed surface portions of said dielectric material layer and filling said first and second spaces with one of an insulating material or a stress overlayer material.

3. The method of claim 1, wherein said performing said at least one etching process to remove said first portions of said respective continuous merged source region and drain region materials comprises forming a third sidewall surface of each of said second portions of said respective continuous merged source region and drain region materials that is opposite of said respective second sidewall surfaces and faces toward said common gate structure.

4. The method of claim 1, wherein said forming said continuous merged source region material and said continuous merged drain region material comprises performing at least one epitaxial deposition process.

5. The method of claim 1, wherein each of said first and second spaces separates respective first or second portions of said plurality of fins from one another.

6. The method of claim 3, wherein said first space is laterally bounded by at least said third sidewall surface of said second portion of said continuous merged source region remaining between said plurality of fins after performing said at least one etching process and said second space is laterally bounded by at least said third sidewall surface of said second portion of said continuous merged drain region remaining between said plurality of fins after performing said at least one etching process.

7. The method of claim 1, wherein said common gate structure is one of a dummy gate structure or a final gate structure.

8. A method of forming a transistor comprising a source/drain region, the method comprising:
forming a plurality of spaced apart fins comprised of a semiconductor material;
forming a common gate structure across said plurality of fins, said common gate structure having first and second sides that are opposite one another;
after forming said common gate structure, performing at least one epitaxial deposition process to form a continuous merged source region epi material and a continuous merged drain region epi material on said plurality of fins and above a fin isolation material positioned between each of said plurality of fins on opposite sides of said common gate structure, said fin isolation material covering lower sidewall surface portions of each of said plurality of fins, wherein said continuous merged source region epi material and said continuous merged drain region epi material are each laterally spaced apart from said common gate structure and extend between and physically contact said plurality of fins, each of said continuous merged source region and drain region epi materials comprising a first portion having a first sidewall surface that faces toward said common gate structure and a second portion having a second sidewall surface that is opposite of said first sidewall surface and faces away from said common gate structure;
performing at least one etching process to:
remove said second portion of said continuous merged source region epi material positioned between said plurality of fins including said second sidewall surface and expose a source-side surface portion of said fin isolation material while leaving said first portion of said continuous merged source region epi material including said first sidewall surface thereof positioned between and in direct physical contact with said plurality of fins and so as to thereby define a first space located on said first side of said common gate structure; and
remove said second portion of said continuous merged drain region epi material positioned between said plurality of fins including said second sidewall surface and expose a drain-side surface portion of said fin isolation material while leaving said first portion of said continuous merged drain region epi material including said first sidewall surface thereof positioned between and in direct physical contact with said plurality of fins and so as to thereby define a second space located on said second side of said common gate structure; and
forming a material in said first and second spaces.

9. A method of forming a transistor comprising a source/drain region, the method comprising:
forming a plurality of spaced apart fins comprised of a semiconductor material;
forming an insulating layer between each of said plurality of fins, said insulating layer covering a lower sidewall surface portion of each of said plurality of fins and exposing an upper sidewall surface portion of each of said plurality of fins;
forming a common gate structure across said plurality of fins and above said insulating layer formed between each of said plurality of fins, said common gate structure having first and second sides that are opposite one another;
after forming said common gate structure, performing at least one epitaxial deposition process to form a continuous merged source region epi material and a continuous merged drain region epi material on said plurality of fins and above said insulating layer formed between said plurality of fins on opposite sides of said common gate structure, wherein said continuous merged source region epi material and said continuous merged drain region epi material are each laterally spaced apart from said common gate structure and extend continuously between and physically contact said plurality of fins, each of said continuous merged source region and drain region epi materials comprising a first portion having a first sidewall surface that faces toward said common gate structure and a second portion having a second sidewall surface that is opposite of said first sidewall surface and faces away from said common gate structure;
performing at least one etching process to:
remove said first portion of said continuous merged source region epi material positioned between said plurality of fins including said first sidewall surface and so as to thereby define a first space located on said first side of said common gate structure and to define an independent source region comprising said second portion of said continuous merged source region epi material including said second sidewall surface that extends continuously between and physically contacts each respective fin of said plurality of fins, said first space exposing a first upper surface portion of said insulating layer on said first side of said common gate structure; and
remove said first portion of said continuous merged drain region epi material positioned between said plurality of fins including said first sidewall surface and so as to thereby define a second space located on said second side of said common gate structure and to define an independent drain region comprising said second portion of said continuous merged drain region epi material including said second sidewall surface that extends continuously between and physically contacts each respective fin of said plurality of fins, said second space exposing a second upper surface portion of said insulating layer on said second side of said common gate structure; and
forming a material in said first and second spaces, said material covering said exposed first and second upper surface portions of said insulating layer.

10. The method of claim 9, wherein said performing at least one etching process to remove said first portions of said respective continuous merged source region and drain region epi materials comprises forming a third sidewall surface of each of said second portions of said respective continuous merged source region and drain region materials that is opposite of said respective second sidewall surfaces and faces toward said common gate structure.

11. The method of claim 10, wherein said first space is laterally bounded by said remaining second portion of said continuous merged source region epi material and said plurality of fins on said first side of said common gate structure and said second space is laterally bounded by said remaining second portion of said continuous merged drain region epi material and said plurality of fins on said second side of said common gate structure.

12. The method of claim 8, wherein said fin isolation material is formed to cover a lower portion and expose an upper portion of each of said plurality of fins.

13. The method of claim 8, wherein said performing said at least one etching process to remove said second portions of said respective continuous merged source region and drain region epi materials comprises forming a third sidewall surface of each of said first portions of said respective continuous merged source region and drain region epi materials that is opposite of said respective first sidewall surfaces and faces away from said common gate structure.

14. The method of claim 8, wherein said forming said material in said first and second spaces comprises covering said respective source-side and drain-side exposed surface portions of said fin isolation material and filling said first and second spaces with one of an insulating material or a stress overlayer material.

15. The method of claim 8, wherein said common gate structure is one of a dummy gate structure or a final gate structure.

16. The method of claim 9, wherein said material formed in said first and second spaces comprises one of an insulating material or a stress overlayer material.

17. The method of claim 9, wherein said common gate structure is one of a dummy gate structure or a final gate structure.

18. The method of claim 13, wherein said first space is laterally bounded by said remaining first portion of said continuous merged source region and said plurality of fins and said second space is laterally bounded by said remaining first portion of said continuous merged drain region and said plurality of fins.

\* \* \* \* \*